United States Patent [19]

Dubon et al.

[11] Patent Number: 4,537,467

[45] Date of Patent: Aug. 27, 1985

[54] HERMETIC SEALING OF GALLIUM ARSENIDE COMPONENTS

[75] Inventors: Chantal Dubon, Versailles, France; Bertil Hök; Christer Ovrén, both of Västerås, Sweden

[73] Assignee: ASEA Aktiebolag, Västerås, Sweden

[21] Appl. No.: 505,278

[22] Filed: Jun. 17, 1983

[30] Foreign Application Priority Data

Jun. 21, 1982 [SE] Sweden ................. 8203826

[51] Int. Cl.³ .................... G02B 5/14; C23C 13/04
[52] U.S. Cl. ................. 350/96.20; 350/96.15; 65/DIG. 15
[58] Field of Search ............. 350/96.20, 96.21, 96.15; 250/227; 156/273.9; 65/32, 36, 58, DIG. 15

[56] References Cited

U.S. PATENT DOCUMENTS

| | | | |
|---|---|---|---|
| 3,209,641 | 10/1965 | Upton | 65/DIG. 15 |
| 3,343,972 | 9/1967 | Hilton, Jr. et al. | 65/DIG. 15 |
| 3,451,794 | 6/1969 | Patterson | 65/DIG. 15 |
| 3,577,629 | 5/1971 | Wallis . | |
| 3,657,006 | 4/1972 | Fisher et al. | 65/DIG. 15 |
| 3,803,511 | 4/1974 | Thompson | 350/96.15 |
| 3,901,996 | 8/1975 | Hasegawa et al. | 65/DIG. 15 |
| 4,376,890 | 3/1983 | Engström et al. . | |
| 4,417,140 | 11/1983 | Adolfsson et al. . | |

FOREIGN PATENT DOCUMENTS

| | | | |
|---|---|---|---|
| 0790554 | 7/1968 | Canada | 156/273.9 |
| 2648702 | 5/1978 | Fed. Rep. of Germany | 65/DIG. 15 |
| 2401879 | 4/1979 | France | 65/32 |

Primary Examiner—William L. Sikes
Assistant Examiner—Akm E. Ullah
Attorney, Agent, or Firm—Watson, Cole, Grindle & Watson

[57] ABSTRACT

An hermetic seal at a smooth interface between a gallium arsenide body and a glass body is effected without organic or inorganic binders by thermally bonding the bodies at the interface while ensuring that the oxygen concentration at the interface is so low that there is no optically detectable variations in color of the gallium arsenide close to the interface.

22 Claims, 6 Drawing Figures the adhesion of the bodies at the interface. Oxidation has been avoided through the method of the invention for example by thermally bonding in a reducing atmosphere, for example a gas mixture of hydrogen gas and nitrogen gas, and by deliberately depleting the oxygen surplus normally occurring in a glass body. A seal according to the invention makes it possible to produce more miniaturized opto-components as well as cheaper opto-components based on gallium arsenide.

Basically the invention involves enclosing the GaAs component by directly sealing it to a glass surface. A suitable method for effecting the seal can be that described in U.S. Pat. No. 3,577,629, modified to take account of the special requirements imposed by the use of GaAs material.

HERMETIC SEALING OF GALLIUM ARSENIDE COMPONENTS

TECHNICAL FIELD

The present invention relates to the production of an hermetic seal between a gallium arsenide component (GaAs) and a glass body at an interface where irregularities larger than 0.1 μm and smaller than 100 μm have been removed.

In the current rapid progress of semiconductor electronics, gallium arsenide has met with a growing interest, primarily because of the following material properties:

Its direct band gap permits efficient electrooptical transformation of energy, which is utilized in photodiodes, light-emitting diodes, laser diodes and optical sensors.

The high mobility of its charge carriers, which can be utilized in the band widths in analog and digital electronics.

It ready alloyability, for example $Al_xGa_{1-x}As$, which makes it possible to provide "tailored" material parameters such as band gap and etching ability in different processes.

DISCUSSION OF PRIOR ART

During the manufacture of opto-components based on GaAs, conventional methods for the protective enclosing of the GaAs are usually employed. Typically the body of GaAs is sealed into a metal capsule provided with glass windows for the necessary optical connection to and from the GaAs body. In some cases the capsule is provided, in addition, with lens elements for the more efficient coupling of the GaAs body to an optical fiber (see Swedish patent application No. 8203597-3). These known methods for packaging the GaAs are not fully satisfactory due to the low attainable degree of miniaturization possible using the method and due to the fact that such methods are expensive and usually constitute a predominant part of the total production costs of the opto-component.

OBJECTS OF THE INVENTION

One object of the invention is to provide an improved method of hermetically bonding gallium arsenide and glassy bodies so that traditional hermetic enclosures can be dispensed with.

A further object is to provide a cheaper gallium arsenide opto-component which has an integral optical member such as a lens or an optical fiber.

Other objects and advantages of the invention will be apparent from the following.

SUMMARY OF THE INVENTION

According to the invention a sealing between a gallium arsenide component and a glass body is characterized in that the interface, cleaned from organic and/or inorganic binders, and exhibiting no optically detectable tints or variations in color on the gallium arsenide side, is formed in such a way that the concentration of oxygen on the glass side is considerably lower than the stoichiometric concentration for oxides, formed by gallium and arsenic. Suitably the low oxygen concentration in the glass body extends at least a distance of 10 microns into the glass body from the interface. Variations of color of GaAs indicate oxidation of GaAs and it has been found that oxidation causes problems with

BRIEF DESCRIPTION OF THE DRAWINGS

The invention will be exemplified in greater detail in the accompanying drawings, in which.

DESCRIPTION OF PREFERRED EMBODIMENTS

Figure 1A:
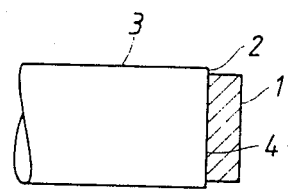
FIGS. 1a and 1b show how a GaAs component can be sealed to one end of an optical fiber.
Figure 1B:
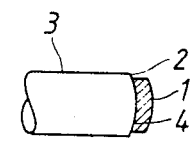

FIG. 1a shows how a GaAs body 1 can be hermetically sealed to one end surface 2 of an optical fiber 3. Creation of a good seal requires the intermediate surface or interface 4 between the fiber 3 and the GaAs body 1 to be plane polished to an optical quality finish, i.e., irregularities larger than 0.1 μm are removed. In FIG. 1a the interface 4 is plane, but this is not necessary. The macroscopic surface structure of the interface 4 may deviate somewhat from planeness (irregularities smaller than 100 μm have also been removed). This is illustrated in FIG. 1b, in which the end surface 2 of the fiber 3 has been made somewhat convex and the GaAs body 1 is thereby subjected to a certain flexural stress during its bonding in place. Another important characteristic for a good bond is that the intermediate surface 4 has no optically detectable variations in color. These color variations occur as a result of oxidation of the GaAs surface. Because of the low adhesion of the oxide of the parent (mother) crystal, the presence of oxide at the interface leads to an inferior bond. The concentration of oxygen in the glass body should therefore be considerably lower than the stoichiometric concentration for oxides, formed by gallium and arsenic at least within a volume between the intermediate surface 4 and a distance therefrom which is not smaller than 10 microns. Another feature of a bond according to the invention is that no organic or inorganic binders are used at the intermediate surface 4. However, the GaAs body may in itself contain dopants or alloying additives, such as the previously-mentioned aluminum additive.

One embodiment of opto-component in accordance with the invention may involve using the bond of this invention on the GaAs body of the fiber optical temperature sensor described in U.S. patent application Ser. No. 194,397, filed Oct. 6, 1980, now U.S. Pat. No. 4,376,890 having at least one photo-luminescent region. Another opto-component on which the bonding method of this invention can be employed is a so-called photo-luminescence diode as described in U.S. patent application Ser. No. 275,789, filed June 22, 1981, now U.S. Pat. No. 4,417,140, possibly also containing active electrical circuit elements.

Figure 2:
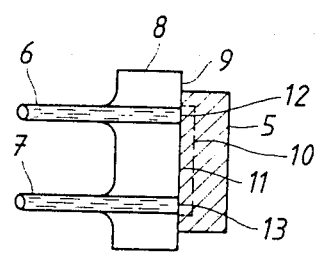
FIG. 2 shows the use of the invention to enclose a GaAs component having electrical leads.

FIG. 2 shows the enclosure of a GaAs body 5 with electrical leads 6, 7, by fusing the body 5 to a plane-polished surface 9 of a glass body 8. The active region 10 of the body 5 is fully protected by the glass on one side, the parent crystal on the other side and the hermetic bond in the plane of the interface 11. The interface 11 has the characteristic properties already described above for the intermediate surface 4 in FIG. 1a. Electrical connection surfaces 12, 13 may be provided at the interface 11 by means of thin metallic coatings, for example forming an alloy with the GaAs crystal and the connections 6, 7.

Figure 3:
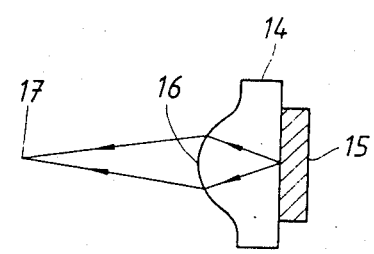
FIG. 3 shows an embodiment of opto-component in which a glass lens body is sealed directly to a GaAs component.

FIG. 3 shows an embodiment in which a glassy body 14, hermetically sealed to a GaAs body 15, forms an optical lens element. Light emanating from the body 15 is focused at a point 17 by reason of the convex limit surface 16 in accordance with the normal optical laws for converging lenses.

Figure 4:
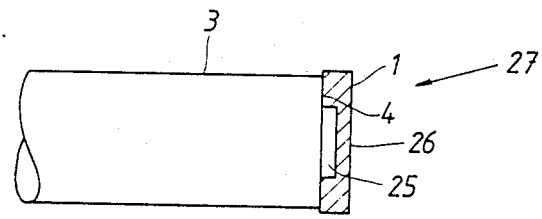
FIG. 4 shows an optical pressure-measuring device, comprising an optical fiber and a bonded-on piece of gallium arsenide.

FIG. 4 shows an optical pressure-measuring device, comprising an optical fiber 3 and a gallium arsenide body 1 defining an elastic diaphragm 26. The diaphragm separates an evacuated or gas-filled volume 25 from the region 27 where the pressure to be measured acts. The diaphragm 26, in a preferred embodiment, is arranged to emit photo-luminescence in at least one wavelength interval, and deflections of the diaphragm on pressure changes in the region 27 alter the amount of luminescent light coupled into the fiber 3.

Figure 5:
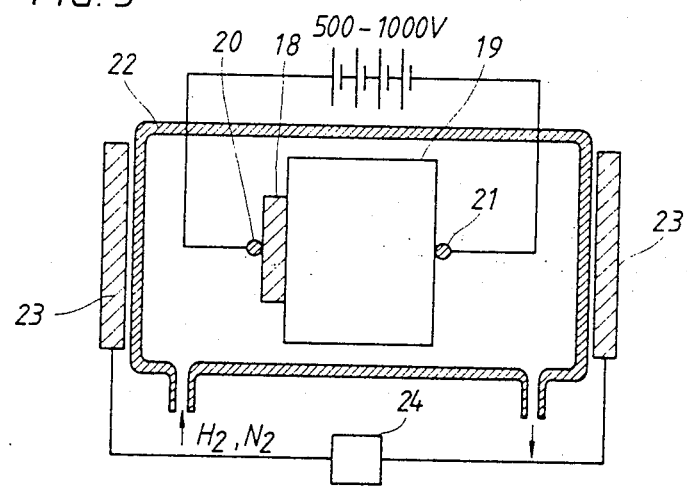
FIG. 5 illustrates one method of effecting the hermetic sealing according to the invention.

FIG. 5 shows one method of implementing a hermetic seal according to the invention. A GaAs body 18 and a glass body 19 have been provided with electrical connections 20, 21 so that a high voltage (e.g. 500 to 1000 volts DC) is applied across them. The bodies 18, 19 have been placed in a container 22, which is purged by a reducing gas, for example, a mixture of hydrogen gas and nitrogen gas. The container 22 is provided with a heating device 23, by means of which the glass body 19 and the GaAs body 18 can be heated to a temperature of 400° C. A temperature regulator 24 is provided for controlling the power supplied to the heating device 23.

The method according to FIG. 5 differs from the method described in U.S. Pat. No. 3,577,629 by the use of a reducing atmosphere. To speed up the processing and to facilitate the bonding together of the two bodies, the glass body 19 may be depleted of surplus oxygen prior to putting it in the container 22, by storing the glass body in a reducing atmosphere. It is important to ensure that the oxygen concentration available at the interface, during the bonding operation, is too low to permit any significant oxidation of the GaAs material.

Preferably, the coefficient of thermal expansion of the glass body 19 does not deviate significantly from that of GaAs, the expansion of which is $6 \times 10^{-6}/°C$. A glass quality which satisfies these demands is available on the U.S. market from Corning Glass under their designation number 0211.

The invention can be varied in many ways within the scope of the following claims.

What is claimed is:

1. A gallium arsenide opto-component comprising an interface between a body of gallium arsenide and a body of glass, said interface being free of surface irregularities larger than 0.1 μm and smaller than 100 μm and said gallium arsenide body and said glass body being hermetically sealed together at said interface,
said interface being free from any bonding medium and having no optically detectable tints, and
said glass body having a concentration of oxygen which, at least in a 10 μm layer adjacent to the interface, is considerably lower than the stoichiometric concentration needed for the formation of oxides selected from the group consisting of gallium oxides and arsenic oxides.

2. An opto-component according to claim 1, wherein said glass body constitutes an optical fiber.

3. An opto-component according to claim 1, wherein at least one of said glass body and said gallium arsenide body is provided with metallic leads.

4. An opto-component according to claim 1, wherein said glass body is in the form of an optical lens element.

5. An opto-component according to claim 2, wherein said gallium arsenide body is arranged to emit light into the optical fiber.

6. An opto-component according to claim 2, wherein said gallium arsenide body contains active electric circuit elements.

7. An opto-component according to claim 1, wherein said interface is interrupted by a closed evacuated volume.

8. An opto-component according to claim 7, wherein said gallium arsenide body defines an elastic diaphragm adjacent to said interface.

9. An opto-component according to claim 7, wherein said gallium arsenide body defines a pressure-sensitive beam adjacent to said interface.

10. A gallium arsenide opto-component comprising a glass light-transmitting member terminating in a first surface and a second surface of a body of gallium arsenide hermetically sealed to said first surface to form said opto-component, said two surfaces being smooth, having no surface irregularities greater than 0.1 μm, and clean, having no detectable tint, and said first surface marking the end of a layer in said glass member which is at least 10 μm thick and which contains a concentration of oxygen which is considerably lower than the stoichiometric concentration needed for forming oxides selected from the group consisting of gallium oxides and arsenic oxides.

11. A method of effecting a hermetic bond between smooth, similarly shaped clean surfaces of a glassy body and a body of gallium arsenide which method comprises thermally bonding said surfaces together under conditions in which the oxygen concentration in the glass body, at least in a 10 μm layer adjacent to said surface thereof, is less than the stoichiometric concentration required for the formation of oxides selected from the group consisting of gallium oxides and arsenic oxides.

12. A method as claimed in claim 11, wherein said surfaces are both substantially plane.

13. A method as claimed in claim 11, wherein said surface of the glass body is somewhat convex while said surface of the gallium arsenide is substantially plane, resulting in a flexural stress in the body of gallium arsenide.

14. A method as claimed in claim 11, wherein an electrical potential of at least 500 volts is applied across the two bodies during the thermal bonding.

15. A method as claimed in claim 11, wherein the thermal bonding is effected in a reducing atmosphere.

16. A method as claimed in claim 14, wherein the thermal bonding is effected in a reducing atmosphere.

17. A method as claimed in claim 15, wherein the reducing atmosphere contains at least one gas selected from the group consisting of hydrogen and nitrogen.

18. A method as claimed in claim 16, wherein the reducing atmosphere contains at least one gas selected from the group consisting of hydrogen and nitrogen.

19. A method as claimed in claim 11, wherein the thermal bonding is effected at a temperature of about 400° C.

20. A method as claimed in claim 11, wherein the glassy body has a coefficient of thermal expansion of about $6 \times 10^{-6}$ per °C.

21. A method as claimed in claim 15, wherein the glassy body is stored in a reducing atmosphere prior to being pressed against the gallium arsenide body for the bonding operation, to deplete the oxygen concentration in the surface layers of said body.

22. An opto-component according to claim 1, wherein said interface is interrupted by a gas-filled volume.

* * * * *